United States Patent [19]

Hoehn et al.

[11] 4,095,194

[45] June 13, 1978

[54] MONOLITHIC INTEGRATED CIRCUIT FOR AN RC OSCILLATOR

[75] Inventors: Wolfgang Hoehn, Kirchzarten; Wolfgang Sauer, Freiburg, both of Germany

[73] Assignee: ITT Industries, Incorporated, New York, N.Y.

[21] Appl. No.: 766,177

[22] Filed: Feb. 7, 1977

[30] Foreign Application Priority Data

Feb. 27, 1976 Germany ............................ 2608026

[51] Int. Cl.$^2$ .............................................. H03K 3/26
[52] U.S. Cl. ................................. 331/108 D; 331/111
[58] Field of Search ............... 331/108 C, 108 D, 111, 331/143

[56] References Cited

U.S. PATENT DOCUMENTS

| | | | |
|---|---|---|---|
| 3,364,441 | 1/1968 | Rogers | 331/111 |
| 3,803,516 | 4/1974 | Wilcox | 331/111 |

*Primary Examiner*—Siegfried H. Grimm

*Attorney, Agent, or Firm*—John T. O'Halloran; Peter C. Van Der Sluys

[57] ABSTRACT

A monolithic integrated circuit for an RC oscillator includes a differential amplifier acting as a switching stage for comparing a threshold voltage corresponding to the maximum oscillator voltage with the capacitor voltage of the RC circuit. An output of the differential amplifier is connected to the S input of an R-S flip-flop which is set when the capacitor voltage reaches the threshold voltage. A switching transistor has its collector and emitter connected across the capacitor and a base connected to the output of the R-S flip-flop for discharging the capacitor when the flip-flop is set. A second transistor has its base-emitter junction connected across the base-collector junction of the switching transistors so that when the switching transistor has discharged the capacitor to a point that only its collector-to-emitter saturation voltage dropped across it, the second transistor is turned on to provide a signal to the reset input of the flip-flop, thereby inhibiting the discharge of the capacitor and allowing the capacitor to recharge through a current source.

6 Claims, 1 Drawing Figure

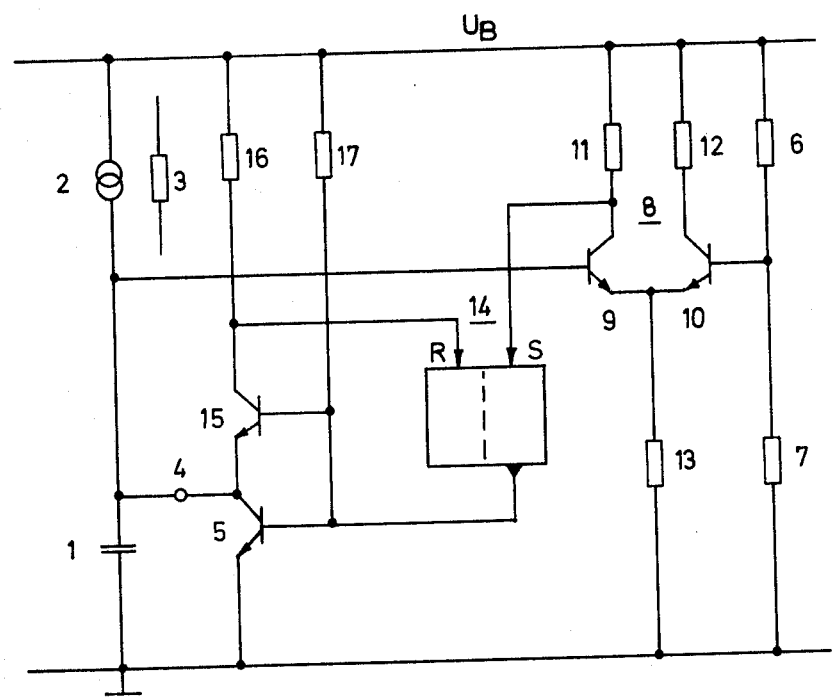

MONOLITHIC INTEGRATED CIRCUIT FOR AN RC OSCILLATOR

BACKGROUND OF THE INVENTION

The present invention relates to a monolithic integrated circuit for an RC oscillator as is known in principle from German Offenlegungsschrift No. 1,921,035.

In the known RC oscillator, the capacitor is charged and discharged between the two voltage values corresponding to the maximum and the minimum oscillator voltage. One terminal of the capacitor is grounded, while the other is connected to a terminal of the integrated circuit and, via a current source, to the live terminal of the supply-voltage source. The known RC oscillator includes a switching stage with a threshold corresponding to the maximum oscillator voltage. Connected in parallel with the capacitor is a discharge-current source which may comprise at least one transistor. In the simplest case, the collector-emitter junction of a switching transistor is connected across the capacitor, which switching transistor is turned on when the voltage across the capacitor reaches the threshold of the switching stage.

In the known RC oscillator, however, the aforementioned switching stage with a threshold corresponding to the maximum oscillator voltage is designed as a threshold circuit with two switching thresholds. The switching stage connects the discharge circuit when the capacitor voltage reaches the upper threshold of response, and disconnects the discharge circuit when the capacitor voltage reaches the lower threshold of response. In an embodiment of the known RC oscillator, the threshold circuit comprises a voltage divider determining the voltage of the upper threshold of response, with one divider resistor being shunted, at the instant the threshold circuit responds, by an additional resistor which is disconnected again when the capacitor voltage reaches the lower switching threshold so obtained.

Such threshold circuits, whose thresholds are preset by means of a voltage divider, usually consist of a differential amplifier having the voltage-divider tap connected to one of its inputs. The lower limit of the lower threshold of response is determined by the base-to-emitter threshold voltage of the differential-amplifier transistor connected to the tap. Especially in the case of circuits having only one supply-voltage source, however, the minimum threshold of response is higher because of the emitter resistor common to both transistors of the differential amplifier.

With the known circuit, it is therefore impossible to utilize the full supply-voltage range for the oscillator voltage because the minimum oscillator voltage cannot be lowered close enough to ground potential.

The smaller the supply voltage available, the more significant this disadvantage becomes. For example, in battery-operated equipment, the ratio of the attainable swing of the oscillator voltage to the battery voltage deteriorates noticeably towards smaller battery voltages.

SUMMARY OF THE INVENTION

It is an object of the present invention to provide a monolithic integrated circuit for an RC oscillator which is not subject to the above-mentioned limitation regarding the lower threshold determining the minimum oscillator voltage, so that, by suitable choice of the upper threshold, as large an oscillator-voltage swing as possible can be selected.

According to a broad aspect of the invention, there is provided a monolithic integrated circuit for an RC oscillator whose capacitor is charged and discharged between two voltage values corresponding to the maximum and the minimum oscillator voltage when one terminal of said capacitor is coupled to ground and the other terminal of said capacitor is coupled to a terminal of an integrated circuit and, via a current source, to the live terminal of a source of supply voltage comprising: a switching stage having a threshold corresponding to the maximum oscillator voltage; a switching transistor having base, emitter and collector terminals for discharging said capacitor when the voltage across said capacitor reaches the threshold voltage of said switching stage, the saturation voltage of said switching transistor serving as the threshold corresponding to the minimum oscillator voltage; control means coupled to said switching stage and said switching transistor for turning said switching transistor on and off; and means for inhibiting said control means allowing said capacitor to be charged.

BRIEF DESCRIPTION OF THE DRAWINGS

The above and other objects of the present invention will be more clearly understood from the following detailed description taken in conjunction with the accompanying drawing which shows a basic circuit diagram of the invention.

DESCRIPTION OF THE PREFERRED EMBODIMENT

The RC oscillator consists of a frequency-determining capacitor 1, one terminal of which is grounded, and of a current source 2, which may be implemented by a resistor 3, for example. Via the current source 2, which has one terminal connected to the live terminal of the supply-voltage source $U_B$, and the other to the ungrounded terminal of the capacitor 1, the latter is charged.

The common terminal of capacitor 1 and current source 2 is connected to one of the external terminals 4 of the monolithic integrated circuit. Via this terminal 4, the collector-emitter junction of the switching transistor 5 is connected in parallel with the capacitor 1, coupled to the integrated circuit from outside. When the transistor 5 is on, the capacitor 1 is discharged through this transistor.

The voltage across the capacitor 1 and, hence, at the terminal 4 can increase until it has reached virtually the same amplitude as the voltage at the tap of the voltage divider connected across the supply-voltage source and consisting of resistors 6 and 7. This tap and the terminal 4 are coupled to the two inputs of a differential amplifier consisting of transistors 9 and 10 and acting as a switching stage 8. The base of the transistor 9 is connected to the capacitor 1 and to the terminal 4, while the base of the transistor 10 is coupled to the tap of the voltage divider. The transistors 9 and 10 are provided with collector resistors 11 and 12 and with a common emitter resistor 13, which may all be replaced, in known manner, by constant current sources.

The output of the switching stage 8, which output is identical with the collector of the transistor 9, is coupled to the S input of an R-S flip-flop 14, which is thus set when the voltage across the capacitor 1 reaches or exceeds the threshold set with the voltage divider 6, 7.

The output associated with the S input of the R-S flip-flop 14 is coupled to the base of the switching transistor 5, so the latter is turned on by the signal applied to it as a result of the R-S flip-flop 14 being set and, consequently, discharges the capacitor 1, as mentioned above.

Connected across the base-collector junction of the switching transistor 5 is the base-emitter junction of the transistor 15, which is turned off when the switching transistor 5 is in the saturation state. The collector of the transistor 15 is connected to the supply voltage $U_B$ via a resistor 16. When the switching transistor 5 has discharged the capacitor 1 to such a point that only its collector-to-emitter saturation voltage drops across it, the transistor 15 is turned on and resets the R-S flip-flop 14 via the latter's R input, whereby the switching transistor 5 is cut off again. Now, the charging of the capacitor 1 through the current source 2 can start anew. According to the invention, the saturation voltage of the switching transistor 5 thus serves as the threshold corresponding to the minimum oscillator voltage.

There are several ways to cause the transistor 15 to conduct when the switching transistor 5 is driven into saturation. For instance, through a resistor 17 connected to the two bases and to that output of the R-S flip-flop 14 associated with the S input, a current driving the switching transistor 5 into the heavily conducting state may be injected into the base of this transistor, thereby increasing the base-to-emitter threshold voltage of this transistor to such a value that the transistor 15 is definitely turned on. On the other hand, the base-to-emitter threshold voltage of the transistor 15 may be lowered in comparison with the base-to-emitter threshold voltage of the switching transistor 5 by making the base-emitter pn junction of transistor 15 larger, preferably by one order of magnitude, than that of the switching transistor 5. By these alternative measures, which are appropriate especially in the case of npn transistors as are shown in the figure for the transistors 5, 9, 10, 15, the base-to-emitter threshold voltage of the transistor 15 can be made smaller than the base-to-emitter threshold voltage of the switching transistor 5, which is reduced by the saturation voltage of this transistor, so the transistor 15 will be on when the switching transistor 5 is operated in the saturation region.

If the transistors 5, 15 are pnp transistors, it will be particularly advantageous to realize both transistors as a single, special two-collector lateral transistor, with the collector of the transistor 15 having to be "behind" the collector of the switching transistor 5 with respect to the current flow. Preferably, the collector of the switching transistor 5 is enclosed by the collector of the transistor 15. Such a lateral transistor structure has the property that, when the transistor belonging to the enclosed collector is driven into saturation, this collector acts as the emitter of the transistor belonging to the enclosing collector, i.e., that the transistor 15 begins to conduct when the switching transistor 5 is driven into saturation. In this case, the collector resistor 16 of the transistor 15 may be dispensed with, and the R input of the R-S flip-flop 14 may be energized directly from the enclosing collector.

If the transistors 5, 15 are npn transistors, they may be combined into a double-emitter transistor whose first emitter is grounded, and whose second emitter is connected to the collector resistor 16, which must now, of course, be called the emitter resistor, and to the R input of the R-S flip-flop 14. As soon as the partial transistor corresponding to the switching transistor 5 is driven on, the second emitter acts as the collector of an inversely operated partial transistor, which energizes the R-input.

It is also advantageous to implement the R-S flip-flop 14 using the so-called I²L technology, while the remaining components are made using conventional bipolar technology. "I²L" is the English abbreviation for "Integrated Injection Logic" and refers to a special bipolar logic circuit fabrication technique, cf. "Elektronikpraxis", October 1975, pp. 7 to 10, and "Philips Technical Review", 1973, pp. 76 to 85.

The monolithic integrated circuit according to the invention shows freqency stability which, in particular, is independent of supply-voltage variations. The circuit already works at operating voltages of as little as 0.8 V, so it can be readily used as the tone generator of a battery-operated alarm clock. Since such alarm clocks are commonly operated with batteries having a rated voltage of 1.5 V which decreases to about IV during the battery life, alarm clocks equipped with the integrated circuit of the invention are capable of oscillating until the end of the battery life.

What is claimed is:

1. A monolithic integrated circuit for an RC oscillator whose capacitor is charged and discharged between two voltage values corresponding to the maximum and minimum oscillator voltage when one terminal of said capacitor is coupled to ground and the other terminal of such capacitor is coupled to a terminal of said integrated circuit and, via a current source, to the live terminal of a source of supply voltage comprising:
    a switching stage having a threshold corresponding to the maximum oscillator voltage, said switching stage having an input connected to the other terminal of the capacitor and an output that provides a signal when an input signal at least equals the threshold;
    a switching transistor having base, emitter and collector terminals for discharging said capacitor when the voltage across said capacitor reaches the threshold voltage of said switching stage, the saturation voltage of said switching transistor serving as the threshold corresponding to the minimum oscillator voltage;
    control means connected to the output of said switching stage and responsive to the signal therefrom for providing a signal to the base of said switching transistor for turning said switching transistor on; and
    means responsive to the saturation voltage of said switching transistor for providing an inhibit signal to said control means, said control means being responsive to the inhibit signal for removing the signal from the base of the switching transistor, thereby allowing said capacitor to be charged.

2. A monolithic integrated circuit for an RC oscillator whose capacitor is charged and discharged between two voltage values corresponding to the maximum and minimum oscillator voltage when one terminal of said capacitor is coupled to ground and the other terminal of said capacitor is coupled to a terminal of said integrated circuit and, via a current source, to the live terminal of a source of supply voltage, comprising:
    a siwtching stage having a threshold corresponding to the maximum oscillator voltage, said switching stage having an input connected to the other terminal of the capacitor and an output that provides a signal when an input signal at least equals the threshold;

a switching transistor having base, emitter and collector terminals for discharging said capacitor when the voltage across said capacitor reaches the threshold voltage of said switching stage, the saturation voltage of said switching transistor serving as the threshold corresponding to the minimum oscillator voltage;

a flip-flop having set and reset inputs and an output, said set input coupled to the output of said switching stage and the output coupled to the base of said switching transistor, said flip-flop being responsive to the signal from the switching stage for providing an output signal to the switching transistor; and inhibiting means responsive to the saturation voltage of said switching transistor for providing a reset signal to the reset input of the flip-flop, whereby said flip-flop is reset and the capacitor is allowed to be charged.

3. A monolithic integrated circuit according to claim 2 wherein said inhibiting means includes a first transistor having base, emitter and collector terminals, the base-collector junction of said switching transistor bypassed by the base-emitter junction of said first transistor and the collector of said first transistor coupled to the reset input of said flip-flop, said first transistor being turned on when said switching transistor is driven into saturation.

4. A monolithic integrated circuit according to claim 3 wherein said first transistor is turned on because the base-emitter pn junction of said switching transistor is an order of magnitude smaller than that of said first transistor when said switching transistor is driven into saturation.

5. A monolithic integrated circuit according to claim 3 wherein said first transistor is turned on by supplying the base of said switching transistor with additional current.

6. A monolithic integrated circuit according to claim 3 wherein said switching transistor and said first transistor are pnp transistors.

* * * * *